(12) United States Patent
Nakajima et al.

(10) Patent No.: US 10,658,143 B2
(45) Date of Patent: May 19, 2020

(54) METHOD OF MANUFACTURING EMITTER

(71) Applicant: HITACHI HIGH-TECH SCIENCE CORPORATION, Tokyo (JP)

(72) Inventors: Yoko Nakajima, Tokyo (JP); Yoshimi Kawanami, Tokyo (JP); Hironori Moritani, Tokyo (JP); Hiroshi Oba, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/280,719

(22) Filed: Feb. 20, 2019

(65) Prior Publication Data

US 2019/0267208 A1 Aug. 29, 2019

(30) Foreign Application Priority Data

Feb. 23, 2018 (JP) ................................ 2018-030577

(51) Int. Cl.
*H01J 9/02* (2006.01)
*H01J 37/305* (2006.01)
*C25F 3/08* (2006.01)
*C25F 3/00* (2006.01)
*C25F 3/16* (2006.01)
*C25F 3/26* (2006.01)

(52) U.S. Cl.
CPC ................ *H01J 9/025* (2013.01); *C25F 3/00* (2013.01); *C25F 3/08* (2013.01); *C25F 3/16* (2013.01); *C25F 3/26* (2013.01); *H01J 37/3053* (2013.01); *H01J 2209/012* (2013.01)

(58) Field of Classification Search
CPC .. H01J 9/025; H01J 37/3053; H01J 2209/012; C25F 3/08; C25F 3/00; C25F 3/16; C25F 3/26
See application file for complete search history.

(56) References Cited

U.S. PATENT DOCUMENTS

| | | | | |
|---|---|---|---|---|
| 2013/0248483 A1* | 9/2013 | Sugiyama | ................. | H01J 9/02 216/11 |
| 2014/0246397 A1* | 9/2014 | Sugiyama | ................. | H01J 9/02 216/11 |
| 2019/0164719 A1* | 5/2019 | Oshima | ................. | H01J 37/073 |
| 2019/0267208 A1* | 8/2019 | Nakajima | ............... | H01J 9/025 |

FOREIGN PATENT DOCUMENTS

JP 07240165 A 9/1995

* cited by examiner

*Primary Examiner* — Duy Vu N Deo
(74) *Attorney, Agent, or Firm* — Holland & Hart LLP

(57) ABSTRACT

Disclosed is a method of manufacturing an emitter in which the tip of the emitter can be formed into a desired shape even when various materials are used for the emitter. The method includes performing an electrolytic polishing process of polishing a front end of a conductive emitter material so that a diameter of the front end is gradually reduced toward a tip; performing a first etching process by irradiating a processing portion of the emitter material processed by the electrolytic polishing process with a charged particle beam; performing a sputtering process by irradiating the pointed portion formed by the first etching process with a focused ion beam; and performing a secondary etching process of further sharpening the tip by an electric field induced gas etching processing while observing a crystal structure of the tip of the pointed portion processed by the sputtering process using a field ion microscope.

11 Claims, 10 Drawing Sheets

METHOD OF MANUFACTURING EMITTER

CROSS REFERENCE TO RELATED APPLICATION(S)

This application claims the benefit of Japan Patent Application No. JP 2018-030577 filed Feb. 23, 2018, which is hereby incorporated by reference in its entirety into this application.

BACKGROUND OF THE INVENTION

1. Technical Field

The present invention relates to a method of manufacturing an emitter used as an emission source that emits electrons, ions, and the like.

2. Description of the Related Art

In the related art, a focused ion beam apparatus has an ion source for generating ions, and emits a focused ion beam in which ions generated from the ion source are focused. For example, a focused ion beam apparatus having a field ionization type ion source as an ion source is known (see, for example, Patent Document 1).

The field ionization type ion source includes an emitter whose tip is sharpened at an atomic level, a gas source for supplying gas such as nitrogen gas or helium gas to the periphery of the emitter, a cooling unit for cooling the emitter, and an extraction electrode disposed at a position away from the tip of the emitter. The field ionization type ion source supplies a gas to the periphery of the emitter by a gas source, and then an extraction voltage is applied between the emitter and the extraction electrode while cooling the emitter by the cooling unit. As a result, the field ionization type ion source generates gas ions by ionizing the gas by the electric field at the tip of the emitter. The generated gas ions are repelled from the emitter to which the positive potential is applied, and are extracted to the extraction electrode. The focused ion beam apparatus accelerates and focuses the extracted gas ions and emits the focused ion beam.

The focused ion beam apparatus having the field ionization type ion source can reduce the beam diameter of the focused ion beam to be emitted and can reduce the energy diffusion of the focused ion beam. As a result, the focused ion beam apparatus can irradiate the sample with the focused ion beam while reducing the beam diameter to a small value. As a result, the focused ion beam apparatus has a high resolution in the observation of the sample by the focused ion beam. In addition, the focused ion beam apparatus has a high accuracy of etching processing by the focused ion beam.

DOCUMENTS OF RELATED ART (Patent Document 1) Japanese Patent Application Publication No. 1995-240165

SUMMARY OF THE INVENTION

In order to generate a focused ion beam having a small beam diameter, it is preferable that the crystal structure of the tip of the emitter is formed into a pyramid shape, and as few atoms as possible are arranged at the distal tip. By doing so, the focused ion beam apparatus having a field ionization type ion source can locally ionize gas to form gas ions, thereby generating a focused ion beam having a small beam diameter.

Here, in the emitter manufacturing method in the related art, the tip of the emitter can be sharpened by reducing the size of the tip (for example, tip diameter) down to 100 nm or less through electrolytic polishing of the conductive emitter material. However, there are some emitter materials in which it is difficult to form the tip in a pyramid shape through the electrolytic polishing. As a result, a method of forming the emitter material capable of sharpening the size of the tip down to 100 nm or less through etching process with a focused ion beam has been developed.

However, in the case of the emitter material formed to have the size of the tip down to 100 nm or less by the etching process using the focused ion beam, traces of the etching process may often be left on the surface. There is a likelihood that this trace may degrade the precision of processing when the distal tip of the emitter material is sharpened to an atomic level, and also there is a likelihood of making it difficult to perform a process performed after etching process during the processing of the emitter material. As a result, the yield in the processing of the emitter material may be deteriorated, and the trace may adversely affect the stable operation of the ion current when used after emitter processing or the regeneration of a structure of the distal tip.

The present invention has been made in view of the above-described problems of the related art, and provides a method of manufacturing an emitter in which the tip of the emitter can be formed into a desired shape even when various materials are used for the emitter.

A method of manufacturing a sharpened needle-shaped emitter according to an aspect of the present invention includes performing an electrolytic polishing process of polishing a front end of a conductive emitter material so that a diameter of the front end is gradually reduced toward a tip; performing a first etching process by irradiating a processing portion of the emitter material processed by the electrolytic polishing process with a charged particle beam to form a pyramid-shaped pointed portion with the tip as an apex; performing a sputtering process by irradiating the pointed portion formed by the first etching process with a focused ion beam using rare gas as an ionizing gas; and performing a secondary etching process of further sharpening the tip by an electric field induced gas etching processing while observing a crystal structure of the tip of the pointed portion processed by the sputtering process with a field ion microscope, thereby making a number of atoms constituting the tip to be equal to or less than a predetermined number.

According to the method, the sputtering process may remove at least any one of damage layer and residual impurity particles of the pointed portion formed by the first etching process.

According to the method, the sputtering process may be performed so that a rate of increase, between before and after performing the sputtering process, of an electric field evaporation voltage of the emitter material is equal to or less than a predetermined value.

According to the method, the first etching process may be performed by irradiation with the focused ion beam, so that an apex angle of the pointed portion is equal to or less than a predetermined angle.

According to the method, the emitter material may be tungsten.

According to the method, the emitter material may be iridium.

According to the method, a size of a processing range of the sputtering process may be set to be equal to or less than a diameter of the focused ion beam.

According to the method, in the sputtering process, the processing range is scanned with the focused ion beam when a size of a processing range of the sputtering process is set to be larger than a diameter of the focused ion beam.

According to the method, the sputtering process may be performed by irradiating the pointed portion with the focused ion beam in an axial direction of the needle-shaped emitter material.

According to the method, the sputtering process may be performed by rotating the emitter material about a central axis while irradiating the pointed portion with the focused ion beam in a direction intersecting an axial direction of the needle-shaped emitter material.

According to the method, the ionizing gas may be argon or xenon.

According to the present invention, it is possible to provide a method of manufacturing an emitter in which the tip of the emitter can be formed into a desired shape even when various materials are used for the emitter.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Embodiment

Hereinafter, an embodiment of the present invention will be described with reference to the drawings. Further, according to an embodiment, an emitter constituting a gas field ion source (GFIS) and used as an emission source of ion beam is described as an example.

First, with reference to FIG. 1, a configuration of a focused ion beam apparatus having a focused ion beam column having the gas field ion source will be described. The focused ion beam apparatus 1 shown in FIG. 1 is an example of a focused ion beam apparatus having the focused ion beam column having the gas field ion source.

<Configuration of Focused Ion Beam Apparatus>

Figure 1:
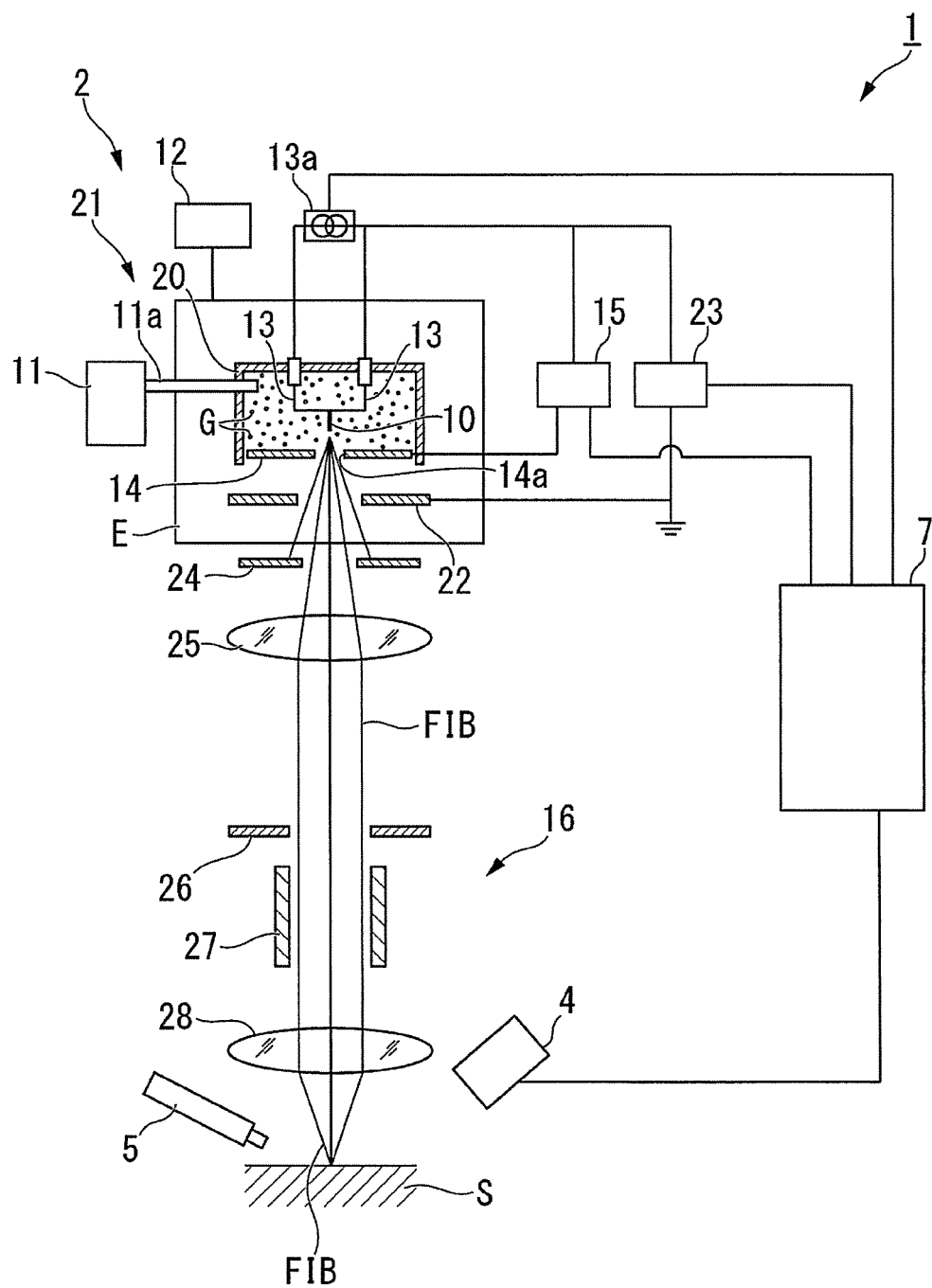
FIG. 1 is an overall configuration diagram illustrating an embodiment of a focused ion beam apparatus having an emitter according to the present invention.

As shown in FIG. 1, the focused ion beam apparatus 1 includes a focused ion beam column 2 for irradiating a sample S placed on a stage (not shown) with a focused ion beam FIB, a detector 4 for detecting secondary charged particles generated by emitting the focused ion beam FIB, a gas gun 5 for supplying a source gas used to form a deposition film, and a control unit 7 for displaying the image data on a display unit (not shown) while forming an image data on the basis of the detected secondary charged particles. The display unit is, for example, a liquid crystal display.

The above stage operates based on an instruction from the control unit 7, and may be displaced, for example, with respect to five axes. Thereby, the focused ion beam apparatus 1 may displace the stage with respect to five axes and irradiate a desired position with the focused ion beam FIB. In addition, the stage is housed in a vacuum chamber (not shown). Accordingly, in the focused ion beam apparatus 1, the focused ion beam FIB is emitted and the source gas is supplied within the vacuum chamber.

The focused ion beam column 2 includes an emitter 10, a gas source 11, a cooling unit 12, a heating unit 13, an extraction electrode 14, an extraction power source 15, and a beam optics 16.

Figure 2:
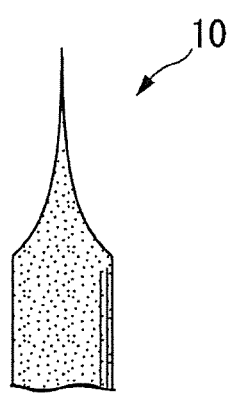
FIG. 2 is an enlarged view illustrating the emitter shown in FIG. 1.
Figure 3:
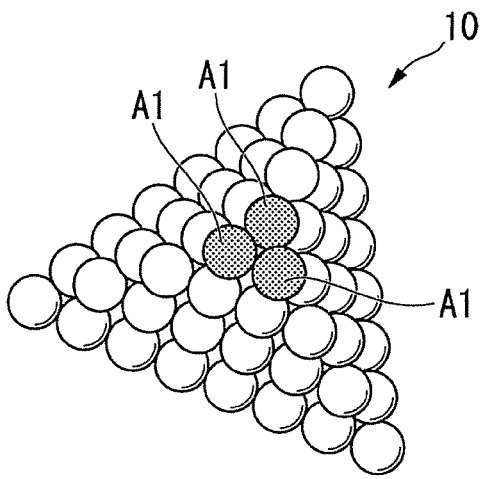
FIG. 3 is an enlarged view of the tip of the emitter shown in FIG. 2 at an atomic level.
Figure 4:
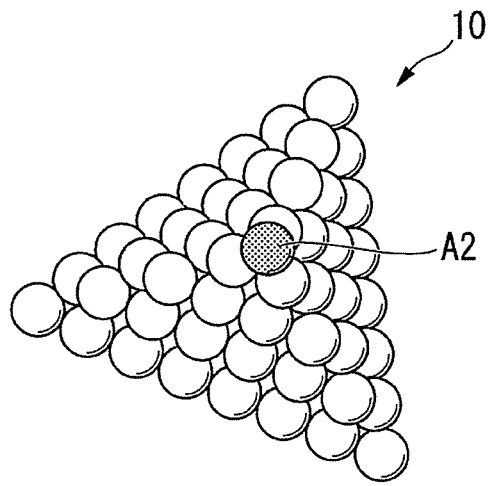
FIG. 4 is an enlarged view illustrating the tip of the emitter shown in FIG. 2 at an atomic level.

The emitter 10 is a needle-shaped conductive member whose tip is sharpened as shown in FIG. 2, and is an emission source that emits ion beam. The emitter 10 is manufactured by a manufacturing method described later. The tip of the emitter 10 is sharpened to the order of atomic level. More specifically, the tip is configured such that the crystal structure thereof is pyramid shaped. For example, the tip is configured in such a state that three atoms A1 are arranged at the distal tip of the emitter 10 as shown in FIG. 3, or one atom A2 is arranged at the distal tip as shown in FIG. 4.

As shown in FIG. 1, the emitter 10 is accommodated and supported in an ion generating chamber 20 in which the inside is maintained in a high vacuum state. The gas source 11 supplies a very small amount of gas G (for example, helium He gas) to the surrounding of the emitter 10 through a gas introducing tube 11a that is communicative to the ion generating chamber 20. The heating unit 13 locally heats the tip of the emitter 10. The heating unit 13 is, for example, a filament. The heating unit 13 locally heats the tip of the emitter 10 to a predetermined temperature by the current from the current source 13a operating in response to a request from the control unit 7, thereby allowing atoms constituting the emitter 10 to be rearranged.

In an opening portion of the ion generating chamber 20, the extraction electrode 14 is disposed apart from the tip of the emitter 10. In the extraction electrode 14, an opening 14a is formed at a position facing the tip of the emitter 10. The extraction power source 15 is an electrode for applying an extraction voltage between the extraction electrode 14 and the emitter 10. The extraction power source 15 serves to apply an extraction voltage so that the gas G is ionized at the distal tip of the emitter 10 to form gas ions and the gas ions is extracted toward the extraction electrode 14.

The cooling unit 12 cools the emitter 10 by a coolant such as liquid helium or liquid nitrogen, in which all of a space E containing the extraction electrode 14 is cooled. In addition, the cooling unit 12 may be another configuration, such as a configuration for cooling a partial space including the emitter 10 among the space E, instead of the configuration cooling all of the space E. That is, the cooling unit 12 is a device for cooling the emitter 10. Also, the cooling unit 12 may be configured to use a refrigerator as a method of cooling all of the space E.

Here, the emitter 10, the gas source 11, the heating unit 13, the extraction electrode 14, the extraction power source 15, and the ion generating chamber 20 constitute the gas field ion source 21 generating gas ions from the gas G.

A negative electrode 22 of a ground potential is provided below the extraction electrode 14. An acceleration power source 23 applies an acceleration voltage between the negative electrode 22 and the emitter 10. The acceleration voltage imparts energy to the extracted gas ions and accelerates the gas ions to form ion beams. Below the negative electrode 22, a first aperture 24 for making the ion beam narrow is provided. Below the first aperture 24, there is provided a condenser lens 25 focusing the ion beam to form a focused ion beam FIB.

Below the condenser lens 25, there is provided a second aperture 26 that is movable in the horizontal direction and further narrows the focused ion beam FIB. Below the second aperture 26, a deflector 27 for scanning the focused ion beam FIB on the sample S is provided. Below the deflector 27, an objective lens 28 for focusing the focused ion beam FIB on the sample S is provided.

Here, the negative electrode 22, the acceleration power source 23, the first aperture 24, the condenser lens 25, the second aperture 26, the deflector 27, and the objective lens 28 constitute the beam optics 16 which forms the extracted gas ions as the focused ion beam FIB and then irradiates the sample S with the focused ion beam FIB. The beam optics 16 also includes a stigmator and a beam position correcting mechanism which are used in the focused ion beam apparatus in the related art, although they are not shown.

The detector 4 detects secondary charged particles such as secondary electrons, secondary ions, reflected ions, scattered ions, and the like emitted from the sample S and outputs the detection result to the control unit 7, when the focused ion beam FIB is irradiated.

The gas gun 5 supplies a compound gas containing a substance (for example, phenanthrene, platinum, carbon, tungsten, or the like) which is a raw material of a deposition film as a raw material gas. The raw material gas is decomposed by irradiation from the focused ion beam FIB and the secondary charged particles generated by the irradiation and separated into a gas component and a solid component. Then, among the solid component and the gas component, the solid component is deposited, thereby forming the deposition film.

In addition, the gas gun 5 may use a material that selectively accelerates etching (for example, xenon fluoride, chlorine, iodine, water). For example, when the sample S is Si-based, xenon fluoride is used. When the sample S is organic-based, water is used. In addition, the focused ion beam apparatus 1 may process the etching of a specific material by irradiating the corresponding material simultaneously with the ion beam.

The control unit 7 performs overall control for all of the focused ion beam apparatus 1 and changes the extraction voltage, the acceleration voltage, the beam current of the focused ion beam FIB, and the like. Therefore, the control unit 7 not only obtains an observation image by freely adjusting the beam diameter of the focused ion beam FIB, but also performs local etching process (roughing process, finishing process, etc.) of the sample S. and so on.

The control unit 7 converts the secondary charged particles detected by the detector 4 into a luminance signal, thereby generating observation image data. Then, the control unit 7 displays the observation image on a display unit on the basis of the generated observation image data. Accordingly, the control unit 7 may provide the operator with the observation image through the display unit.

The control unit 7 is connected to an input unit (not shown) capable of being inputting by the operator, and controls all of the focused ion beam apparatus 1 on the basis of a signal input by the input unit. Therefore, the operator may irradiate a desired region with the focused ion beam FIB and then observe the region, etch the desired region, deposit a deposition film by irradiating the desired region with the focused ion beam FIB while supplying a source gas, and so on, through the input unit.

<Manufacturing Method of Emitter>

Next, a method of manufacturing an emitter 10 will be described by taking two emitter materials as examples with reference to the flowchart shown in FIG. 5. The emitter material is a material for the emitter 10.

<Case where Emitter Material is Tungsten Single Crystal>

First, an electrolytic polishing process is performed in which the front end of an emitter material 30, which is an example of the emitter material, is electrolytically polished so that a diameter thereof is gradually reduced toward a leading end of the tip (Step S10). In this example, the emitter material 30 is a tungsten single crystal.

Figure 6:
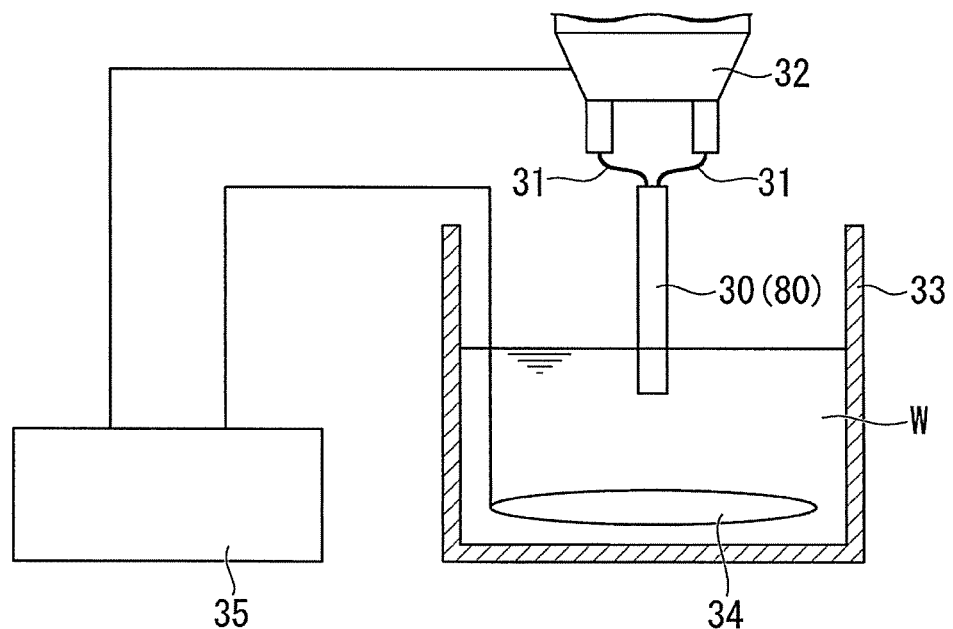
FIG. 6 is a view illustrating one step in manufacturing the emitter, in which the front end of the emitter material is electrolytically polished in an electrolytic polishing process.

Specifically, as shown in FIG. 6, a wire made of tungsten single crystal having, for example, a crystal plane (111) in the axial direction is first prepared as the emitter material 30, and a proximal end of the emitter material 30 is held by the holding tool 32 through the fixing wire member 31, for example.

In addition, as the wire which is the emitter material 30, for example, one having a diameter of 0.1~0.3 mm and a length of a few mm is used. The fixing wire 31 serves to heat the emitter material 30 by passing current, as well as to support the emitter material 30.

The front end of the emitter material 30 held by the holding tool 32 is immersed in the polishing solution W stored in a polishing tank 33. As the polishing solution W, for example, a KOH (potassium hydroxide) solution of 3 mol/L may be used. In the polishing tank 33, a negative electrode 34 is disposed.

Then, an etching voltage (for example, DC 3 V) is applied between the emitter material 30 and the negative electrode 34 by a voltage applying unit 35 for a predetermined etching time (for example, about 400 seconds), and electrolytic polishing process is performed for the front end of the emitter material 30.

Figure 7:
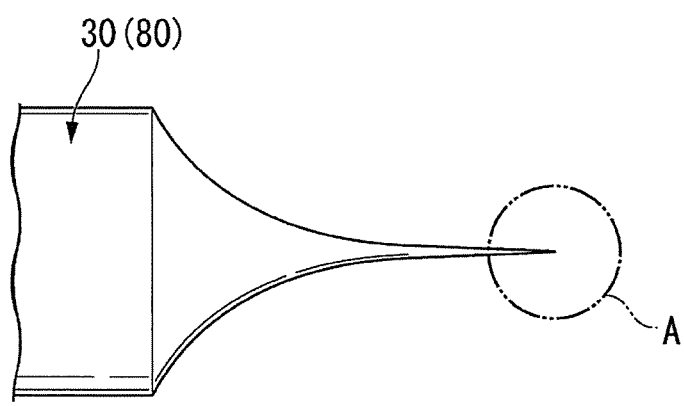
FIG. 7 is an enlarged view of the frond end of the emitter material processed by the electrolytic polishing process shown in FIG. 6.
Figure 8:
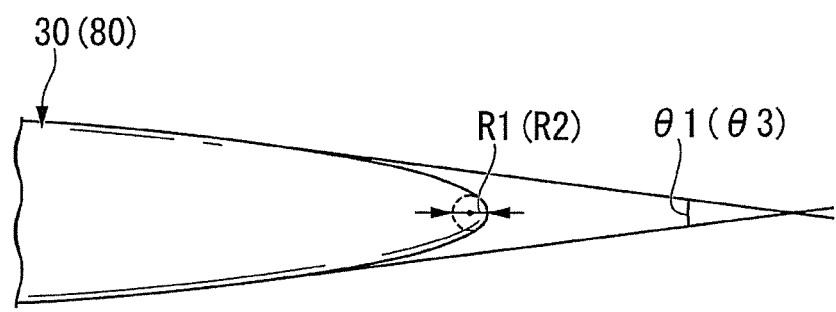
FIG. 8 is an enlarged view of a portion A shown in FIG. 7.

As a result, as shown in FIG. 7, in the electrolytic polishing process (step S10), the front end of the emitter material 30 may be roughly sharpened in such a manner that a diameter thereof is gradually reduced toward the tip. Herein, as shown in FIG. 8, the electrolysis polishing process is performed until the diameter R1 of the tip becomes 100 nm or less, more specifically 30 to 80 nm, and the apex angle θ1 of the tip becomes about 10 to 30 degrees, as processing target values.

Figure 9:
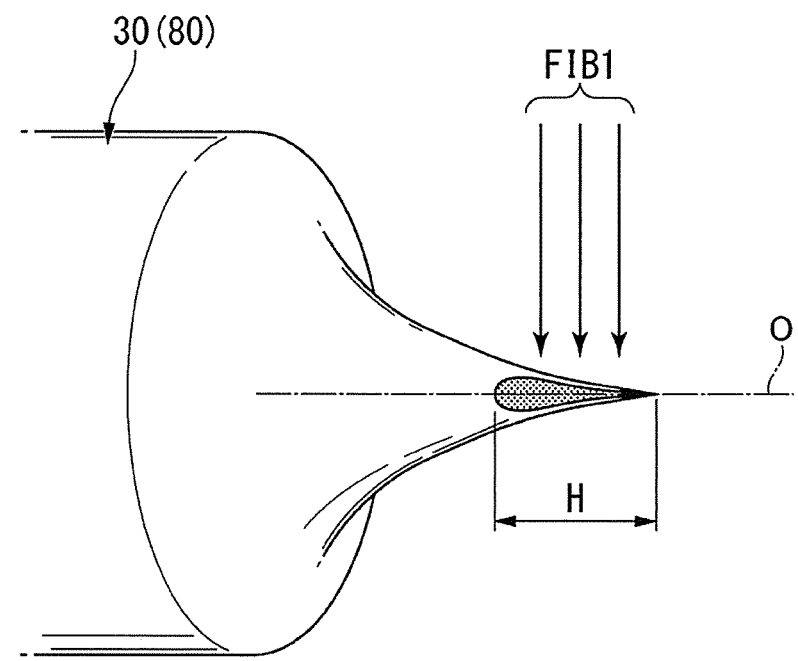
FIG. 9 is a diagram showing a state in which the electrolytic polishing processing area is etched by the first focused ion beam FIB1 after performing an electrolytic polishing process.
Figure 10:
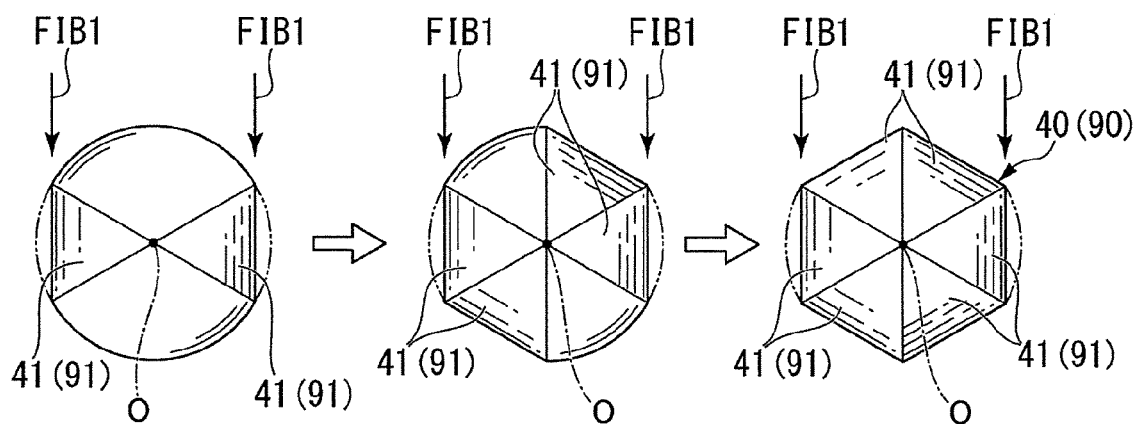
FIG. 10 is a view showing procedures until a pointed portion is formed by an etching process with the first focused ion beam FIB shown in FIG. 9.
Figure 11:
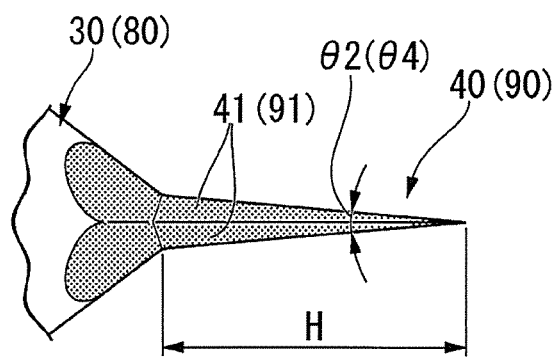
FIG. 11 is an enlarged view of a pointed portion formed at the front end of an emitter material by etching processing with the first focused ion beam FIB1 shown in FIG. 9.

Next, after the electrolysis polishing process (step S10) is completed, as shown in FIGS. 9, 10, and 11, an area subject to the electrolytic polishing process is irradiated by the focused ion beam (for example, the first focused ion beam FIB1 to be described later) to perform a first etching process (step S20) that performs an etching process. Hereinafter, as an example, a case will be described in which the focused ion beam is the focused ion beam constituted by gallium ions. That is, in terms of the first etching process, a charged particle beam apparatus 50 that emits the first focused ion beam FIB1 described later is different from the focused ion beam apparatus 1 shown in FIG. 1.

Figure 12:
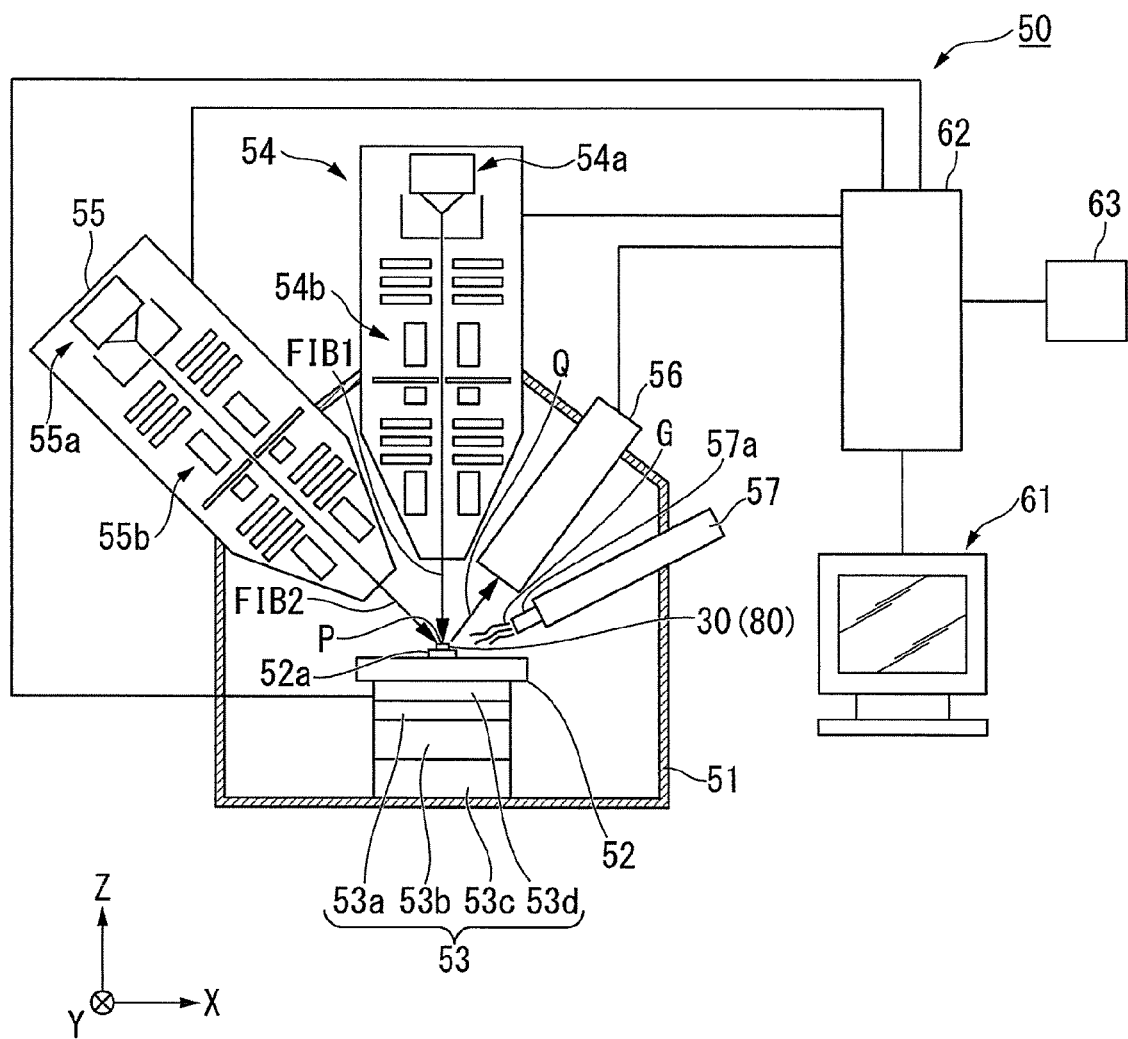
FIG. 12 is an overall configuration diagram illustrating an example of a charged particle beam apparatus for processing an emitter material in a first etching step and a sputtering step according to an embodiment of the present invention.

First, an example of the charged particle beam apparatus 50 will be described. FIG. 12 is a configuration diagram of the charged particle beam apparatus 50 according to an embodiment of the present invention. As shown in FIG. 12, the charged particle beam apparatus 50 includes a sample chamber 51 in which the inside is capable of being maintained in a vacuum state, a stage 52 for holding the sample in the sample chamber 51, and a stage driving mechanism 53 for driving the stage 52. The charged particle beam apparatus 50 has a first focused ion beam irradiation optical system 54 and a second focused ion beam irradiation optics 55 that irradiate an object in a predetermined irradiation area (i.e., scanning range) inside the sample chamber 51 with respective focused ion beams FIB1 and FIB2. In addition, the charged particle beam apparatus 50 may also include an electron beam irradiation optics (not shown) that irradiates the irradiation object in the predetermined irradiation area inside the sample chamber 51 with electron beams.

The charged particle beam apparatus 50 includes a detector 56 that detects secondary charged particles (secondary electrons, secondary ions) Q generated from the irradiation object by irradiation by the respective focused ion beams FIB1 and FIB2 or electron beams. The charged particle beam apparatus 50 has a gas supply unit 57 that supplies gas G to a surface of the irradiation object. Specifically, the gas supply unit 57 is a nozzle having an outer diameter of about 200 μm. The charged particle beam apparatus 50 includes a display device 61 for displaying image data or the like based on the secondary charged particles Q detected by the detector 56, a computer 62, and an input device 63.

The charged particle beam apparatus 50 according to this embodiment is capable of imaging the irradiated portion, performing various processes (excavation, trimming, etc.) by sputtering, forming a deposition film, and so on, by irradiating a surface of the irradiation object with the respective focused ion beams FIB1 and FIB2. The charged particle beam apparatus 50 irradiates the surface of the irradiation object with the respective focused ion beams FIB1 and FIB2 or electron beams, thereby observing the surface of the irradiation object.

The sample chamber 51 may be configured such that the inside thereof is evacuated to a desired vacuum state by an evacuation device (not shown) while being maintaining at a desired vacuum state.

The stage 52 is provided with a holder fixing table 52a to which a holder P for holding the sample is fixed. The holder holding table 52a may be configured to mount a plurality of holders P.

The stage driving mechanism 53 is accommodated in the sample chamber 51 in a state that is connected to the stage 52. The stage driving mechanism 53 displaces the stage 52 relative to the predetermined axis in accordance with a control signal output from the computer 62. For example, the stage driving mechanism 53 is a seven-axis driving mechanism in which a five-axis driving mechanism and a two-axis driving mechanism are detachably combined. The five-axis driving mechanism includes a moving mechanism 53a for moving the stage 52 in parallel along an X-axis and a Y-axis which are parallel to the horizontal plane and orthogonal to each other, and a Z-axis in a vertical direction orthogonal to the X axis and the Y axis. The five-axis driving mechanism includes an inclination mechanism 53b for inclining the stage 52 around the X axis or the Y axis and a rotation mechanism 53c for rotating the stage 52 about the Z axis. The two-axis driving mechanism is mounted on the five-axis driving mechanism, and includes a second inclination mechanism 53d for inclining the stage 52 around each axis of two axes parallel to the horizontal plane and orthogonal to each other, independently from the X-axis and the Y axis.

The first focused ion beam irradiation optics 54 is provided to make a beam output unit (not shown) inside the sample chamber 51 face the stage 52 at an upper position in the vertical direction of the stage 52 in the irradiation region, and make an optical axis U (FIB1) parallel to the vertical direction. The first focused ion beam irradiation optics 54 is fixed to the sample chamber 51. Accordingly, the first focused ion beam FIB1 may be irradiated from top to bottom in the vertical direction on the irradiation object such as a sample placed on the stage 52.

The second focused ion beam irradiation optics 55 is provided to make a beam output unit (not shown) inside the sample chamber 51 face the stage 52 in a direction inclined at a predetermined angle with respect to the vertical direction of the stage 52 in the irradiation region, and make the optical axis U (FIB2) parallel to the inclined direction. The second focused ion beam irradiation optics 55 is fixed to the sample chamber 51. Accordingly, the second focused ion beam FIB2 may be irradiated from top to bottom in the inclined direction on an irradiation object such as a sample placed on the stage 52.

The respective first and second focused ion beam irradiation optics 54 and 55 include respective ion sources 54a and 55a for generating ions and respective ion optics 54b and 55b for focusing and deflecting ions extracted from the respective ion sources 54a and 55a. The respective ion sources 54a and 55a and the respective ion optics 54b and 55b are controlled in accordance with a control signal output from the computer 62, so that irradiation positions and irradiation conditions of the respective focused ion beams FIB1 and FIB2 are controlled by the computer 62.

The ion source 54a of the first focused ion beam irradiation optics 54 is, for example, a liquid metal ion source using liquid gallium or the like. The ion source 55a of the second focused ion beam irradiation optics 55 is a gas field ion source that uses, for example, a rare gas such as argon or xenon, as an ionizing gas.

The respective ion optics 54b and 55b include, for example, a first electrostatic lens such as a condenser lens, an electrostatic deflector, and a second electrostatic lens such as an objective lens.

The detector 56 detects an intensity (i.e., amount of secondary charged particles) of secondary charged particles (secondary electrons and secondary ions) Q emitted from the irradiation object when irradiating the irradiation object such as a sample with the respective focused ion beams FIB1 and FIB2 or electron beams, and outputs information on the detecting amount of the secondary charged particles Q. The detector 56 is disposed at a position where the amount of secondary charged particles Q may be detected inside the sample chamber 51, for example, at an oblique and upward position with respect to the irradiation object such as a sample in the irradiation region, and is fixed to the sample chamber 51.

The gas supply unit 57 is fixed to the sample chamber 51 and has a gas injection portion 57a (for example, a nozzle or the like) inside the sample chamber 51, in which the gas injection portion 57a is disposed in such a manner as to face the stage 52. The gas supply unit 57 may provide the sample with an etching gas for selectively promoting etching of the sample with the respective focused ion beams FIB1 and FIB2 depending on the material of the sample, and a deposition gas for forming a deposition film of deposits such as a metal or an insulator on the surface of the sample. For example, by supplying xenon fluoride for a silicon-based sample and etching gas such as water for an organic-based sample to the sample, while irradiating the respective focused ion beams FIB1 and FIB2, the etching is promoted selectively according to the material. In addition, for example, a deposition gas containing platinum, carbon, or tungsten may be supplied to the sample while the respective focused ion beams FIB1 and FIB2 are emitted, whereby a solid component decomposed from the deposition gas may be deposited on the surface of the sample. As specific examples of the deposition gas, there are a gas containing carbon such as phenanthrene, naphthalene, or pyrene, a gas containing platinum such as trimethyl ethylcyclopentadienyl platinum, and a gas containing tungsten such as tungsten hexa carbonyl, and the like. The etching or the deposition may be also performed by just emitting electron beams in a certain supply gas.

The computer 62 controls the stage driving mechanism 53, the respective focused ion beam irradiation optics 54 and 55, and the gas supply unit 57.

The computer 62 is disposed outside the sample chamber 51 and is connected to a display device 61 and an input device 63, such as a mouse and a keyboard, for outputting a signal according to an input operation of an operator.

The computer 62 performs overall control for the operation of the charged particle beam apparatus 50 by a signal output from the input device 63, a signal generated by a predetermined control processing, or the like.

The computer 62 converts the amount of the secondary charged particles Q detected by the detector 56 while scanning the irradiation position of the charged particle beam, into the luminance signal corresponding to the irradiation position, and generates image data representing the shape of the irradiation object by the two-dimensional position distribution of the detected amount of the secondary charged particles Q. The computer 62 causes the display device 61 to display a screen for performing operations such as enlarging, reducing, moving, and rotating of the image data, in addition to the generated image data. The computer 62 causes the display device 61 to display a screen for performing various settings such as mode selection and processing setting in the automatic sequence control.

Hereinafter, an operation of performing an etching process on the emitter material 30 as a sample of the irradiation object using the charged particle beam apparatus 50 will be described. Specifically, as shown in FIGS. 9 and 10, among electrolytic polishing regions of the emitter material 30 processed by the electrolysis polishing process, for example, over a processing region H of about 50 μm from the tip, the first focused ion beam FIB1 is irradiated while the emitter material 30 is intermittently rotated about its axis O, thereby forming a pyramid-shaped pointed portion 40. In the illustrated example, the pyramid-shaped pointed portion 40 has six-sided pyramidal surfaces 41 processed with the first focused ion beam FIB1, thereby forming a hexagonal pyramid-shaped pointed portion 40.

Herein, as shown in FIG. 11, the pointed portion 40 is finished so that when the tip of the pointed portion 40 is an apex, an apex angle θ2 thereof is equal to or less than a first predetermined angle. The first predetermined angle is, for example, 20 degrees. Although the first predetermined angle may be smaller or larger than 20 degrees, the first predetermined angle is preferably small. The first predetermined angle is an example of a predetermined angle. In the example shown in the drawing, the apex angle θ2 is about 10 degrees.

Thus, in the emitter manufacturing method according to the present embodiment, the hexagonal pyramid-shaped pointed portion 40 that is very sharpened to the order of nanometer may be fabricated by the first etching process (step S20). Particularly, this method uses the first focused ion beam FIB1, so that the processing deviation may be suppressed and the pointed portion 40 may be finely formed into a desired shape. However, on the surface of the emitter material 30 processed by the first etching process (step S20), trace of processing with the first focused ion beam FIB1 may sometimes be left (engraved). The trace, for example, includes at least one of residual impurity particles by charged particles (in this example, gallium ions) constituting the first focused ion beam FIB1 as particles remaining on the surface, and damage layers formed to with trace of processing by the first focused ion beam FIB1 as marks formed on the surface. In addition, the trace may include other marks derived from the processing by the first focused ion beam FIB1 instead of these marks. When the traces are left (engraved) on the surface, there is a likelihood that the traces will degrade the processing accuracy when sharpening the distal tip of the emitter material 30 at an atomic level, and make it difficult to process the emitter material 30. As a result, the yield in the processing of the emitter material 30 may be deteriorated. In addition, the traces may adversely affect the stable operation of the ionic current when used after emitter processing or the regeneration of the distal tip structure.

Thus, in the manufacturing method of the emitter according to the present embodiment, after the first etching process (step S20) is completed, the surface of the emitter material 30 in which the pointed portion 40 is formed by the first etching process (step S20) is subject to a sputtering process for removing the trace of the etching process formed by the first focused ion beam FIB1 (step S25).

Figure 13:
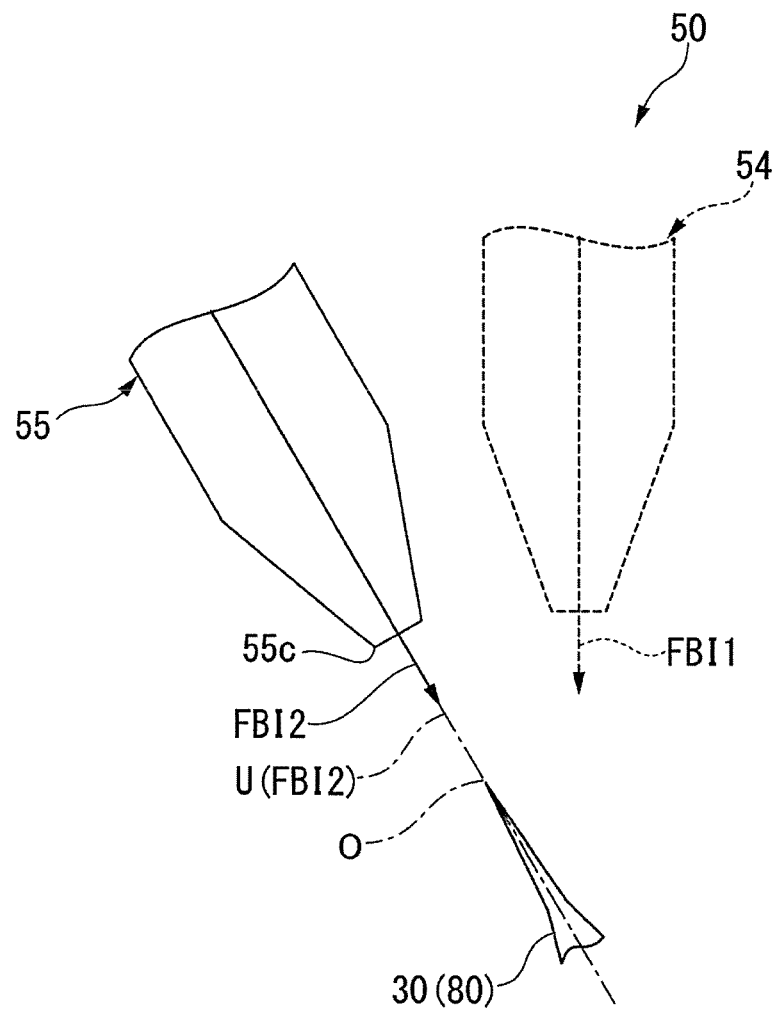
FIG. 13 is a view illustrating an example of a relative arrangement relationship between the second focused ion beam irradiation optics and the emitter material of a charged particle beam apparatus in the sputtering process.

More specifically, as shown in FIG. 13, following the first etching process (step S20), the charged particle beam apparatus 50 is used to cause the axis O of the emitter material 30 to be coaxially arranged with the optical axis U (FIB2) of the second ion beam irradiation optics 55, and the front end of the emitter material 30 to face a beam exit port 55c of the second focused ion beam irradiation optics 55. Then, the second focused ion beam FIB2 is irradiated from the axis O direction on the processing object portion including the pointed portion 40 of the front end of the emitter material 30 to perform a sputtering process.

A size of a processing object in the sputtering process (step S25) is set to be narrower than the size of the processing region H in the first etching process (step S20). For example, an outer diameter of the processing object in the sputtering process (step S25) is more than 10 µm but less than 20 µm in diameter with centering on the distal tip of the pointed portion 40 of the emitter material 30. For example, when the diameter of the second focused ion beam FIB2 is smaller than the outer diameter of the processing object, the processing object is irradiated by the second focused ion beam FIB2. On the other hand, when the diameter of the second focused ion beam FIB2 is equal to or larger than the outer diameter of the processing object, the emission of the second focused ion beam FIB2 is unnecessary.

A processing rate of the sputtering process (step S25) using the second focused ion beam FIB2 varies depending on the beam current and the acceleration voltage, and is smaller in one to three digits compared to an electrolysis polishing such as the electrolysis polishing process (step S10). As a result, the surface processing time of the electrolytic polishing process is relatively short, for example, from 0.01 to several seconds, whereas the irradiation time of the second focused ion beam FIB2 in the sputtering process (step S25) is about more than 10 minutes to several tens of minutes, and the irradiation time, that is, the amount of processing may be easily adjusted. Also, the acceleration voltage of the second focused ion beam FIB2 in the sputtering process (step S25) is, for example, set to be lower than the acceleration voltage of the first focused ion beam FIB1 in the first etching process (step S20).

In the sputtering process (step S25), the sputtering process is performed so that an rate of increase, between before and after performing the sputtering process, of the electric field evaporation voltage of the emitter material 30 becomes a predetermined value or less. For example, the predetermined value is a predetermined voltage increase rate with respect to a threshold value of the electric field evaporation voltage, and is set to about 30%. The threshold value of the electric field evaporation voltage refers to, for example, a threshold voltage at which a predetermined crystal plane around a {111} crystal plane, which is a center of the surface of the tip of the emitter material 30, becomes a desired clean crystal plane.

The threshold value of the electric field evaporation voltage is related to a parameter indicating a degree of sharpness of the tip of the pointed portion 40 in the emitter material 30 and varies in an increasing direction as the degree of sharpness decreases, for example. The parameter indicating the degree of sharpness of the tip of the pointed portion 40 is, for example, a radius of curvature of the tip, the apex angle when using the tip as the apex, or the like. That is, the rate of increase, between before and after performing the sputtering process of the electric field evaporation voltage of the emitter material 30 is controlled to be equal to or less than a predetermined value, so that the tip shape of the pointed portion 40 formed by the first etching process may be maintained within a desired allowable variation range even after performing the sputtering process.

Also, the predetermined value of the increase rate of the electric field evaporation voltage set for the sputtering process may be set to be lower than a predetermined value of an increase rate of the electric field evaporation voltage capable of being set for electrolytic polishing such as the electrolysis polishing process (step S10). As described above, the electrolytic polishing is difficult to perform relatively detailed and high-precision processing compared to the sputtering process, so that the variation of the tip shape of the pointed portion 40 is large, whereby there is a concern that the tip shape of the pointed portion 40 formed by the first etching process may not be maintained within the desired allowable change range after performing the electrolytic polishing. For example, the rate of increase, between before and after performing the electrolytic polishing process, of the electric field evaporation voltage of the emitter material 30 may become excessively greater than 50%, whereby there is a concern that it is impossible to appropriately set the predetermined value for the rate of increase of the electric field evaporation voltage that is necessary in order to maintain the tip shape of the pointed portion 40 within a desired allowable variation range. With respect to such problems, in the sputtering process, it is easy to perform relatively detailed and high-precision processing compared to the electrolytic polishing, it is possible to prevent a variation of the tip shape of the pointed portion 40 from increasing, and it is possible to appropriately set the increase rate of the electric field evaporation voltage that is necessary in order to maintain the tip shape of the pointed portion 40 within a desired allowable variation range.

Figure 14:
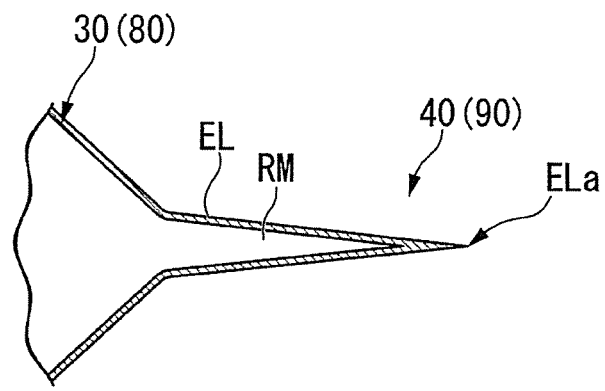
FIG. 14 is a cross sectional diagram showing a state in which the emitter material is etched by the first focused ion beam FIB1 in the first etching process.
Figure 15:
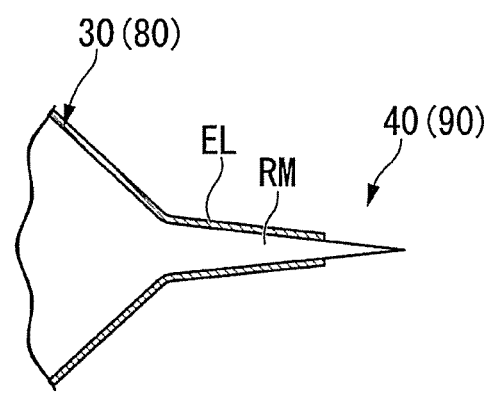
FIG. 15 is a cross-sectional diagram of the emitter material after the sputtering process is completed.

Accordingly, in the sputtering process (step S25), a distal front end portion ELa of the surface EL that is a part of the processing region H in the first etching process (step S20) shown in FIG. 14 and includes traces of the etching process by the first focused ion beam FIB1 may be removed as shown in FIG. 15. FIG. 14 is a cross sectional diagram showing a state in which the emitter material is etched by the first focused ion beam FIB1 in the first etching process (step S20). This cross section refers to a cross section of the front end of the emitter material 30 when the emitter material 30 is taken along the axis O of the emitter material 30. FIG. 15 is a cross-sectional view of the emitter material 30 after the sputtering process (step S25) is finished. This cross section refers to a cross section of the front end of the emitter material 30 when the emitter material 30 is taken along the axis O of the emitter material 30. The surface EL shown in FIG. 14 is a portion where the traces of the etching processing by the first focused ion beam FIB1 is left (engraved) at the front end of the emitter material 30. A thickness of the surface EL is about 50 nm. A non-polishing portion RM shown in FIGS. 14 and 15 refers to a portion left (engraved) with no traces of the etching processing by the first focused ion beam FIB1 in the front end of the emitter material 30.

Subsequently, after the sputtering process (step S25) is completed, a second etching process (S30) is performed so that the tip is further sharpened to the order of atomic level by an electric field induced gas etching process, while observing the crystal structure of the tip at the pointed portion 40 observed by a field ion microscope.

This process will be described in detail.

Figure 16:
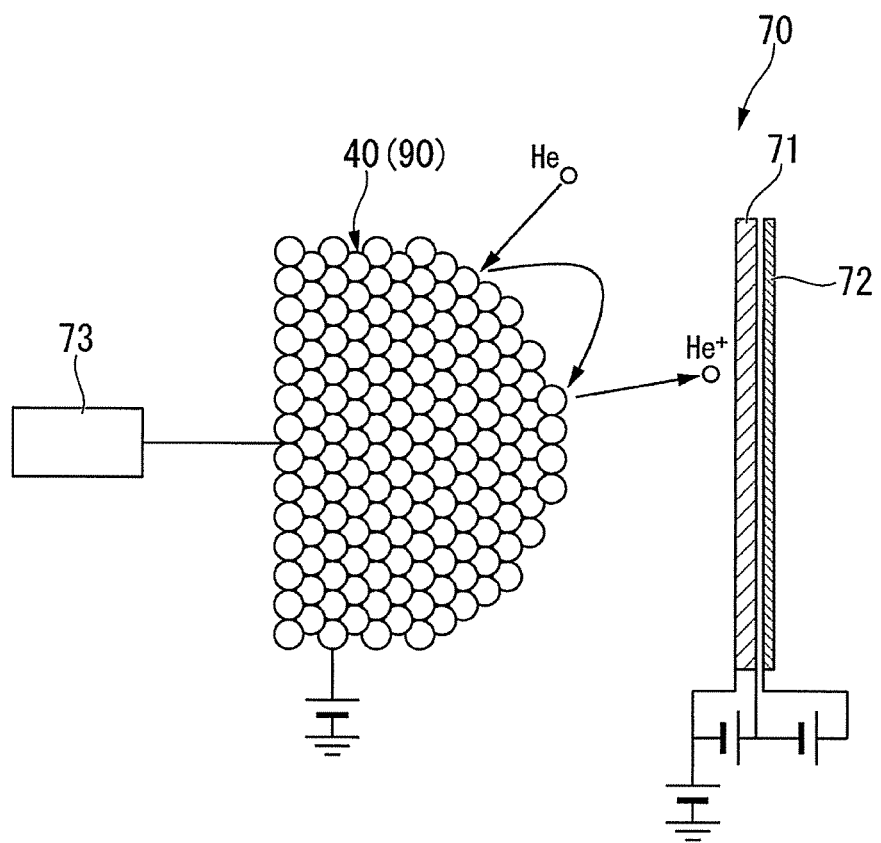
FIG. 16 is a view illustrating a state in which the emitter material shown in FIG. 11 is set in a field ion microscope.

First, as shown in FIG. 16, the field ion microscope (FIM) 70 has a vacuum chamber (not shown) in which various gases are introduced at a predetermined pressure, a microchannel plate (MCP) 71 spaced with respect to the pointed portion 40 of the emitter material 30 in the vacuum chamber, a fluorescent screen 72 that illuminates an FIM image (electric ion image) at the tip of the pointed portion 40 amplified by the MCP 71, and a heating unit 73 such as a heater for heating the emitter material 30.

In addition, FIG. 16 shows a crystal structure in the pointed portion 40 of the emitter material 30.

When a high voltage is applied to the emitter material 30 in the state that an inert gas such as Helium gas (He) is introduced into the vacuum chamber in the field ion microscope 70 constructed as described above, the helium gas is ionized by a strong electric field in the vicinity of atoms constituting the tip of the pointed portion 40 and moves toward the MCP 71 side along the electric force line. Then, the helium ions obtained by ionizing the helium gas are converted into electrons in the MCP 71, amplified, and then incident on the fluorescence screen 72. As a result, the field ion microscope 70 may is configured so that the FIM image at the tip of the pointed portion 40 is illuminated on the fluorescent screen 72 and the crystal structure of the tip is provided to the operator.

Here, while observing the crystal structure of the tip of the pointed portion 40 by the operator, when mixing gas (not shown) containing either or both of oxygen and nitrogen is introduced into the vacuum chamber in addition to helium gas, the mixing gas removes atoms of tungsten by which an electric field induced gas etching process may be performed.

Therefore, in the second etching step (step S30), the tip of the pointed portion 40 may be gradually sharpened by performing the electric field induced gas etching process. As a result, in this method, the tip may be sharpened to the order of atomic level. In this case, the more the pointed portion 40 is sharpened, the fewer atoms make up the distal tip. As a result, a bright spot on the FIM image gradually decreases with the lapse of time.

In the second etching process (step S30), the processing is performed until the number of atoms (number of bright spots) constituting the distal tip is set to a certain number or less (for example, several to several tens) by performing observation with the field ion microscope 70. As a result, the shape of the pointed portion 40 may be sharpened to the order of atomic level. In particular, since the number of atoms constituting the distal tip of the pointed portion 40 may be reduced to the certain number or less, it is possible to construct the distal tip with far fewer atoms compared to the related art.

Subsequently, after the second etching step (step S30) is completed, a heating process (step S40) is performed in which the emitter material 30 is heated and atoms constituting the distal tip of the pointed portion 40 are arranged in a pyramid shape.

In the present embodiment, the heating process (step S40) is performed while the emitter material 30 is set in the field ion microscope 70 shown in FIG. 16. Specifically, voltage application to the emitter material 30 is stopped while discharging helium gas and the mixed gas from the vacuum chamber. Thereafter, the emitter material 30 is heated by the heating unit 73, for example, for 5 minutes at a temperature of 700° C. to 1200° C. In addition, in the heating process (step S40), voltage application (remolding) to the emitter material 30 may be performed while heating the emitter material 30.

Thus, in the heating process (step S40), it is possible to arrange atoms at the distal tip of the emitter material 30. Particularly, since the number of atoms constituting the distal tip is smaller compared to the related art, these few atoms may be arranged in an ideal pyramid shape. That is, in the heating process (step S40), as shown in FIGS. 3 and 4, the crystal structure of the distal tip may be provided so that, for example, three atoms A1 or one atom A2 is arranged at the distal tip. As a result, in the heating process (step S40), the atoms of the distal tip may be provided as the crystal structure, whereby it is possible to manufacture the needle-shaped emitter 10 shown in FIG. 2, which is sharpened to the order of atomic level.

After the heating process (step S40) is completed, helium gas is again introduced into the vacuum chamber. Then, when voltage is applied to the emitter 10, and the FIM image is observed, it will be ascertained that one or three bright spots may be observed, and the FIM image is provided with a crystal structure in which three atoms A1 or one atom A2 is arranged in the distal tip.

A series of operations of the emitter manufacturing methods is completed as mentioned above.

As shown in FIG. 1, the gas field ion source 21 having the emitter 10 manufactured as described above may emit ion beams with a small beam diameter at a high luminance. Therefore, the focused ion beam apparatus 1 that uses focused ion beam FIB using the ion beams and has the gas field ion source 21 makes it possible to observe the sample S at a high resolution when observing the sample S, and to perform a very detailed and high-precision processing on the sample S when processing the sample S.

In addition, when the crystal structure of the emitter 10 is changed as the gas field ion source 21 having the emitter 10 is used, the focused ion beam apparatus 1 having the gas field ion source 21 performs treatment by heating and rearrangement of the atoms. In this case, since the number of atoms constituting the distal tip of the emitter 10 of the present embodiment is smaller compared to the related art, the focused ion beam apparatus 1 may efficiently rearrange these few atoms. Therefore, the focused ion beam apparatus 1 may return the crystal structure of the distal tip of the emitter 10 to the original pyramid shape with good reproducibility. Therefore, in the focused ion beam apparatus 1, a yield of heating and regenerating of the emitter 10 may be improved. In addition, in the focused ion beam apparatus 1, since the trace of the processing with the first focused ion beam FIB1 is removed from the emitter 10, it may be expected that the reproducibility of the rearrangement and the repetition frequency are improved.

In addition, since a small number of atoms may be efficiently rearranged, the heating time may be shortened and the diameter of the front end of the emitter 10 may be prevented from becoming thick. Therefore, in the focused ion beam apparatus 1, an increase in the optimum value of the extraction voltage after treatment may be suppressed, and the optimum value may be made substantially constant, as compared with the emitter in the related art. As a result, in the focused ion beam apparatus 1, the life of the emitter 10 may be increased, and the emitter 10 may be used continuously for a long time.

<When Emitter Material is Iridium (210) Single Crystal>

Hereinafter, the case where the emitter material is an iridium (210) single crystal will be described. Hereinafter, the emitter material of iridium (210) single crystal, is referred to as an emitter material 80 for convenience of explanation.

Here, the emitter material 80 is difficult to form the tip thereof down to 100 nm or less only by the electrolysis polishing process (step S10). This is because the crystal structure of the iridium (210) single crystal, which is the emitter material 80, is anisotropic (asymmetric). However, even when a material having anisotropic crystal structure such as iridium (210) single crystal is used as the emitter material, in the above-described emitter manufacturing method (the method described in the flowchart shown in FIG. 5), the tip of the emitter may be formed into a desired shape.

Figure 5:
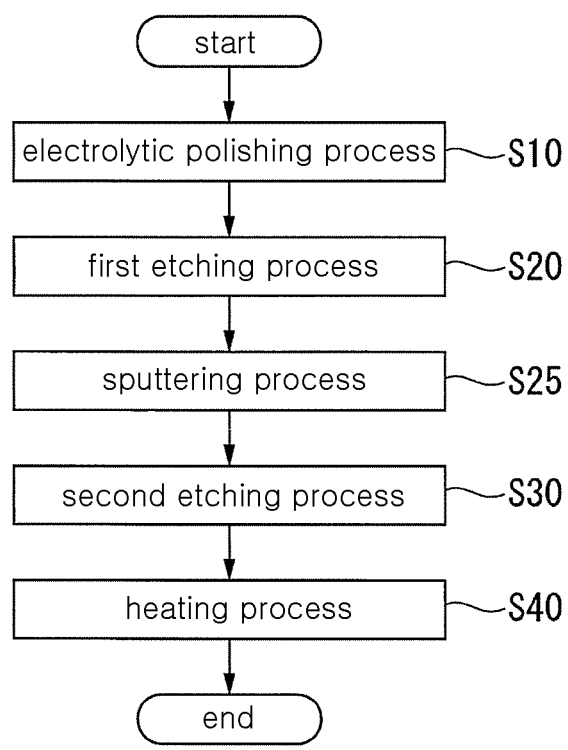
FIG. 5 is a flowchart illustrating a manufacturing method of the emitter shown in FIG. 2.

In the case of using the emitter material 80 in the manufacturing method of the emitter described in the flowchart shown in FIG. 5, the "emitter material 30" is replaced with the "emitter material 80" in terms of the above description of "the case where the emitter material is a tungsten single crystal". However, the description of the method is different from the description of "the case where the emitter material is a tungsten single crystal" in the following points in each process.

In the electrolysis polishing process (step S10, see FIG. 6), a wire made of iridium (210) single crystal is prepared instead of a wire made of tungsten single crystal. In this case, the wire has a diameter of about 0.1 to 0.3 mm and a length of several mm to 10 mm. Also, in the electrolysis polishing process (step S10), as a polishing solution W, a solution of KOH (potassium hydroxide) of several mol/L or the like may be used. Thus, in the electrolysis polishing process (step S10), the front end of the emitter material 80 may be roughly sharpened in such a manner that a diameter thereof is gradually reduced toward the leading end of tip. Herein, as a processing object, the electrolytic polishing processing is performed in the electrolysis polishing process (step S10) until a diameter (R2) of the tip shown in FIG. 8 becomes 50 μm or less. As shown in FIG. 8, a tip apex angle θ3 corresponds to the tip diameter R2 of the front end of the emitter material 80 such that the tip apex angle θ1 corresponds to the tip diameter R1 of the front end of the emitter material 30. For example, when the tip diameter R2 of the emitter material 80 is greater than the tip diameter R1 of the emitter material 30, the tip apex angle θ3 of the emitter material 80 is greater than the tip apex angle θ1 of the emitter material 30.

In the first etching process (step S20, see FIG. 9), among a portion of the emitter material 80 that is electrolytically polishing processed by the electrolysis polishing process (step S10), for example, over a processing region H of 50 μm from the tip, the first focused ion beam FIB1 is irradiated while the emitter material 80 is intermittently rotated about the axis O emitter material 80, so that the pointed portion 90 of the emitter material 80 is formed into a pyramid shape. For example, as shown in FIG. 10, the outer shape of the pointed portion 90 is formed in a hexagonal pyramid shape having six-sided pyramidal shaped surfaces 91. At this time, as shown in FIG. 11, the pointed portion 90 is finished so that the vertex angle θ4 is equal to or less than a second predetermined angle when using the tip of the pointed portion 90 as a vertex. The second predetermined angle is, for example, 30 degrees. The second predetermined angle may be an angle smaller than 30 degrees or an angle larger than 30 degrees. However, the second predetermined angle is preferably small. The second predetermined angle is an example of a predetermined angle.

In the sputtering process (step S25, see FIG. 13), similarly to the emitter material 30, the sputtering process is performed by irradiating the processing object including the pointed portion 90 of the front end of the emitter material 80 with the second focused ion beam FIG. 2 from the axis O direction. In this case, the sputtering process is performed so that the rate of increase, before and after performing the sputtering process of the electric field evaporation voltage of the emitter material 80 becomes a predetermined value or less. For example, the predetermined value is a predetermined voltage increase rate with respect to a threshold value of the electric field evaporation voltage, and is set to about 30%. The threshold value of the electric field evaporation voltage refers to, for example, a threshold voltage at which a {100} crystal plane adjacent to a {210} crystal plane, which is a center of the surface of the tip of the emitter material 80 and two {111} crystal planes become desired clean crystal planes.

In the heating process (step S40), the voltage application to the emitter material 80 is stopped while discharging the helium gas and the mixed gas from the vacuum chamber. Thereafter, the heating unit 73 heats the emitter material 80, for example, for about one minute at a temperature of about 300° C. to 700° C. In addition, in the heating process (step S40), the voltage application (remolding) to the emitter material 80 may be performed while heating the emitter material 80.

As described above, the manufacturing method of the emitter according to the present embodiment may form the tip of the emitter into a desired shape even when the emitter material is an iridium (210) single crystal. That is, the above-described method enables forming the tip of the emitter into a desired shape even when the material of the emitter is various.

As described above, according to the manufacturing method of the emitter according to the embodiment of the present invention, since the sputtering process (step S25) is performed subsequently to the first etching process (step S20), detailed and high-precision processing may be performed while preventing the generation of impurities in the minute processing object. In the sputtering process, the respective pointed portions 40 and 90 of the respective emitter materials 30 and 80 formed by the first etching process are irradiated by the second focused ion beam FIB2 to perform the sputtering process, whereby it is possible to gradually process the minute regions by a small amount at a smaller processing rate compared to, for example, the case where electrolytic polishing is performed on the respective pointed portions 40 and 90. For example, according to the electrolytic polishing, the processing amount increases over a wide area with a relatively short processing time and the polishing is promoted at the tip of the respective sharp pointed portions 40 and 90, whereby there is a concern that it becomes difficult to maintain a shape of the tip of the respective pointed portions 40 and 90. With respect to such a problem, according to the sputtering process, for example, even when the tip of the respective needle-shaped pointed portions 40 and 90 is a minute region of several tens micrometers, detailed and high-precision processing may be performed by a small amount for a relatively long processing time, and the tip shape of the respective pointes points 40 and 90 formed by the first etching process may be desirably maintained.

In addition, for example, according to the electrolytic polishing, there are concerns that impurities starting to dissolve in the polishing solution may re-adhere to the processing object when the processing object is a specific element, and it is difficult to remove impurities from the respective pointed portions 40 and 90 of the respective emitter materials 30 and 80. With respect to this problems, the sputtering process makes it possible to prevent impurities removed from the respective pointed portions 40 and 90 of the respective emitter materials 30 and 80 by the sputtering from re-adhering to the respective pointed portions 40 and 90, and to appropriately remove residual impurity particles such as gallium caused by the first focused ion beam FIB1 of the first etching process, for example.

Further, in the sputtering process, since the second focused ion beam FIB2 is emitted with ionized gas being a rare gas, the generation of impurities due to the beam may be prevented by using the rare gas having relatively low reactivity.

In addition, in the sputtering process, the processing is performed in vacuum, and the charged particle beam apparatus 50 is used, whereby vacuum state may be maintained from the first etching process, and intrusion of impurities from the outside may be prevented.

Further, according to the sputtering process, it is possible to prevent a size of the processing object from being relatively increased, so that the generation of impurities accompanied by an increase in the size of the processing object to be processed may be suppressed.

The sputtering process is performed so that the rate of increase before and after performing the sputtering process, of the electric field evaporation voltage of the respective emitter materials 30 and 80 becomes a predetermined value or less. Accordingly, the tip shape of the respective pointed portions 40 and 90 formed by the first etching process may be maintained within a desired allowable variation range even after performing the sputtering process.

In addition, the technical scope of the present invention is not limited to the above-described embodiment, and various modifications may be added within the scope of the present invention.

For example, although the emitter 10 for the gas field ion source 21 has been described in the above embodiment, the present invention is not limited to this case. For example, the emitter may an emitter used as an emission source for emitting electrons to form electron beams.

In addition, in the first etching process (step S20), the etching process is performed by emitting the first focused ion beam FIB1. However, the present invention is not limited to the first focused ion beam FIB1, but may use charged particle beams. For example, an etching process may be performed using electron beams or the like. In the first etching process, the shapes of the respective pointed portions 40 and 90 are hexagonal pyramid-shaped, but may be, for example, triangular pyramid, twelve-sided pyramid, twenty four-sided pyramid, and thirty six-sided pyramid. In addition, the shape of the respective pointed portions 40 and 90 may be a conical shape by spiral processing or the like. Even in this case, the respective pointed portions 40 and 90 may be sharpened to the order of nanometer, and thereafter the number of atoms constituting the distal tip may be reduced by the second etching step (step S30).

In the heating process (step S40), after the respective emitter materials is set in the field ion microscope 70 as shown in FIG. 16, the field ion microscope 70 is used and the respective emitter materials 30 and 80 are heated. Also, the respective emitter materials 30 and 80 may be set in the gas field ion source 21 shown in FIG. 1 after the second etching step (step S30), and then the heating process (step S40) may be performed. In this case, it is possible to operate the gas field ion source 21 immediately after the heating process (step S40).

In the above-described embodiments, the charged particle beam apparatus 50 shown in m FIG. 12 is used in the first etching process and the sputtering process, but the present invention is not limited thereto.

For example, the focused ion beam apparatus that emits the first focused ion beam FIB1 in the first etching process and the focused ion beam apparatus that emits the second focused ion beam FIB2 in the sputtering process may be different apparatuses that are independent of each other.

Also, for example, in the first etching process, a focused ion beam apparatus that emits the focused ion beam constituted by ions different from gallium ions, like the focused ion beam apparatus 1, may be used. In this case, the focused ion beam apparatus may be the focused ion beam apparatus that uses a rare gas such as argon or xenon as an ionizing gas, like the sputtering process, and the first etching process and the sputtering process may be performed using the same focused ion beam apparatus.

In the above-described embodiment, in the sputtering process, the respective pointed portions 40 and 90 are irradiated with the second focused ion beam FIB2 from the axis O direction of the respective needle-shaped emitter materials 30 and 80, but the present invention is not limited thereto.

For example, the respective pointed portions 40 and 90 may be irradiated by second focused ion beam FIB2 from a direction (e.g., a direction perpendicular to the axis O) that intersects the axis O of the respective emitter materials 30 and 80. In this case, the respective emitter materials 30 and 80 may be rotated about the axis O (i.e., a central axis) with respect to the second focused ion beam FIB2.

Further, the embodiment described above is presented as an example, and is not intended to limit the scope of the invention. These new embodiments can be implemented in various other forms, and various omissions, substitutions, and alterations can be made without departing from the gist of the invention. These embodiments and their modifications are included in the scope of the invention and the scope of the invention described in the claims and the equivalents thereof.

What is claimed is:

1. A method of manufacturing a sharpened needle-shaped emitter, the method comprising:
    performing an electrolytic polishing process of polishing a front end of a conductive emitter material so that a diameter of the front end is gradually reduced toward a tip;
    performing a first etching process by irradiating a processing portion of the emitter material processed by the electrolytic polishing process with a charged particle beam to form a pyramid-shaped pointed portion with the tip as an apex;
    performing a sputtering process by irradiating the pointed portion formed by the first etching process with a focused ion beam using rare gas as an ionizing gas; and
    performing a secondary etching process of further sharpening the tip by an electric field induced gas etching processing while observing a crystal structure of the tip of the pointed portion processed by the sputtering process with a field ion microscope, thereby making a number of atoms constituting the tip to be equal to or less than a predetermined number.

2. The method of claim 1, wherein the sputtering process removes at least any one of damage layer and residual impurity particles of the pointed portion formed by the first etching process.

3. The method of claim 1, wherein the sputtering process is performed so that a rate of increase, between before and after performing the sputtering process, of an electric field evaporation voltage of the emitter material is equal to or less than a predetermined value.

4. The method of claim 1, wherein the first etching process is performed, by irradiation with the focused ion beam, so that an apex angle of the pointed portion is equal to or less than a predetermined angle.

5. The method of claim 1, wherein the emitter material is tungsten.

6. The method of claim 1, wherein the emitter material is iridium.

7. The method of claim 1, wherein a size of a processing range of the sputtering process is set to be equal to or less than a diameter of the focused ion beam.

8. The method of claim 1, wherein, in the sputtering process, the processing range is scanned with the focused ion beam when a size of a processing range of the sputtering process is set to be larger than a diameter of the focused ion beam.

9. The method of claim 7, wherein the sputtering process is performed by irradiating the pointed portion with the focused ion beam in an axial direction of the needle-shaped emitter material.

10. The method of claim 7, wherein the sputtering process is performed by rotating the emitter material about a central axis while irradiating the pointed portion with the focused ion beam in a direction intersecting an axial direction of the needle-shaped emitter material.

11. The method of claim 1, wherein the ionizing gas is argon or xenon.

* * * * *